United States Patent
Cox et al.

(10) Patent No.: US 6,194,683 B1
(45) Date of Patent: Feb. 27, 2001

(54) SNAP TOGETHER PCMCIA CARDS WITH LASER TACK WELDED SEAMS

(75) Inventors: Wilton Louis Cox, Charlotte; Charles David Fieselman, Concord; Leonard Douglas Hobgood; Paul Gilbert Watson, Jr., both of Durham; Simon Yu, Harrisburg, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/484,783

(22) Filed: Jan. 18, 2000

Related U.S. Application Data (62) Division of application No. 08/937,411, filed on Sep. 25, 1997, which is a division of application No. 08/506,240, filed on Jul. 24, 1995, now Pat. No. 5,861,602.

(51) Int. Cl.⁷ .................................................. B23K 26/00
(52) U.S. Cl. .................. 219/121.63; 228/9; 228/44.3; 228/49.1
(58) Field of Search ................ 219/121.63, 121.64; 29/825, 841; 361/737, 745; 228/9, 44.3, 49.1

(56) References Cited

U.S. PATENT DOCUMENTS

| | | | |
|---|---|---|---|
| 3,586,816 | 6/1971 | Hagen | 219/121 |
| 4,386,388 | 5/1983 | Beun | 361/399 |
| 4,833,295 | 5/1989 | Locker et al. | 219/121.63 |
| 4,845,447 | 7/1989 | Holdsworth | 333/167 |
| 4,873,415 | 10/1989 | Johnson et al. | 219/121.64 |
| 4,899,030 | 2/1990 | Miyazaki et al. | 219/121.63 |
| 5,031,076 | 7/1991 | Kiku | 361/424 |
| 5,107,073 | 4/1992 | Steffen | 174/52.1 |
| 5,250,782 | 10/1993 | Cordelle et al. | 219/121.64 |
| 5,268,555 | 12/1993 | Jones et al. | 219/121.63 |
| 5,276,298 | 1/1994 | Jones et al. | 219/121.63 |
| 5,302,801 | 4/1994 | Kanda et al. | 219/121.63 |
| 5,339,222 | 8/1994 | Simmons et al. | 361/818 |
| 5,354,964 | 10/1994 | Kyoren et al. | 219/121.84 |
| 5,386,340 | 1/1995 | Kurz | 361/737 |
| 5,397,857 | 3/1995 | Farquhar et al. | 174/52.1 |
| 5,414,597 | 5/1995 | Lindland et al. | 361/816 |
| 5,463,531 | 10/1995 | Choon et al. | 361/737 |
| 5,731,566 | * 3/1998 | Steinhart | 219/121.63 |
| 5,951,890 | * 9/1999 | Beuch et al. | 219/121.64 |

OTHER PUBLICATIONS

Credit Card Adapter Cover Set, Lawrence et al, IBM Technical Disclosure Bulletin, vol. 37, No. 08, Aug. 1994; RA8930110.

PCMCIA Wireless WAN Package, Lawrence et al, IBM Technical Disclosure Bulletin, vol. 37, No. 08, Aug. 1994; RA8930380.

\* cited by examiner

*Primary Examiner*—Samuel M. Heinrich
(74) *Attorney, Agent, or Firm*—Lawrence R. Fraley (57) ABSTRACT

The top and bottom parts of a one-piece cover of a PCMCIA card are snapped together to form lap-joint seams which are welded together with a laser, under argon gas. Only a few small tack welds are required to substantially increases the mechanical strength and moisture resistance and to eliminate the risk of accidentally opening the card. The operation can be done at a high rate with minimal cost. Also, an internal frame may be made much narrower to allow more card area, while still meeting structural requirements for PCMCIA cards. The weld penetrates fully through the first layer of the seam and only partially through a second layer. During welding a fixture holds the seams in reasonably precise position and tightly closed so the seams are much tighter after welding than when the card is only snap closed. The precise positioning of the seams also allows the size of the weld to be minimized which reduces the risk of burn through which may damage electronic components enclosed within the card during welding. The card is plugged into an externally accessible slot in a computer system during operation.

7 Claims, 11 Drawing Sheets

SNAP TOGETHER PCMCIA CARDS WITH LASER TACK WELDED SEAMS

CROSS-REFERENCE TO COPENDING APPLICATIONS AND ISSUED PATENT

This application is a divisional of U.S. patent application Ser. No. 08/937,411, filed Sep. 25, 1997 which is a divisional of parent application Ser. No. 08/506,240, filed Jul. 24, 1995 now U.S. Pat. No. 5,861,602. All of these are assigned to the same assignee.

FIELD OF THE INVENTION

The invention of this application relates to the manufacture of small peripheral cartridges which plug into exterior slots of computer systems. More specifically the inventions relate to PCMCIA cards and methods of manufacturing such cards.

BACKGROUND OF THE INVENTION

This section discusses background information useful to enable those skilled in the art to make and use the inventions of Applicant's. It is not an admission that any information herein is prior art or is analogous art or that a search adequate for examination, has been made.

Small credit card sized computer peripherals which plug into slots in a computer system have become very popular especially for portable computers. A specification by the Personal Computer Memory Card International Association (PCMCIA) for PC memory cards was released September 1991. The specification is available as issue PCMCIA PC Card Standard Release 2.0 from the association. The cards are required to be 85.6 mm long and 54.0 mm wide which is the same size as a standard credit card. Three types of cards are specified, all with the same length and width and same thickness of a card guide sections, but with different respective thicknesses of a thicker section of the card. The thicker sections of Type I cards are 3.3 mm thick, Type II cards are 5 mm thick, Type III cards are 10.5 mm thick. The specification includes minimum structural requirements for withstanding torque, bending, flexing, impact (drop), shock, vibration, warpage, moisture, and other mechanical requirements. The cards are also required to meet standards for withstanding EMI, RF, and ESD that are usually met by providing a metal cover. The cards are also required to meet other standards set by JEDIC, ISO and others. The specification also includes details of a 68 pin connector and slot size for the cards.

The cards are used for flash memory, networking, modem connections to telephone systems, hard drives, cellular telephone connection, sound cards, and I/O interface with other external peripherals. Although primarily used for laptop and palmtop systems, recently card slots have appeared in desktop systems.

U.S. Pat. No. 3,586,816 to Hagen, suggests laser focusing and optics for microscopic multiple spot welding.

U.S. Pat. No. 4,386,388 discloses a cover formed of sheet aluminum which is lap jointed and spot welded.

U.S. Pat. No. 4,833,295 to Locker suggests laser or electro beam welding of a lap joint.

U.S. Pat. No. 4,845,447 suggests tack welding a cover plate on a trap filter in a video cable distribution system.

U.S. Pat. No. 4,873,415 to Johnson suggests laser welding a lap joint to form a weld which is not continuous between galvanized steel sheets.

U.S. Pat. No. 5,302,801 to Kanda suggests using a oxygen-free atmosphere for laser welding leads of semiconductor devices to junctions on printed circuit boards and laser welding devices for such applications.

U.S. Pat. No. 5,107,073 to Steffen suggests ultrasonic welding between plastic surfaces to connect the upper and lower shells of a credit card sized cartridge containing fragile logic circuits.

U.S. Pat. No. 5,276,298 to Jones suggests using a Nd:YAG (yttrium aluminum garnet) laser to form overlapping spot welds to weld the metal edge of a lap joint.

U.S. Pat. No. 5,339,222 to Simmons et al suggests a metal, snap-together cover and dielectric frame for a PCMCIA card.

U.S. Pat. No. 5,354,964 to Kyoren suggests a source and apparatus to deliver inert gas such a argon to a high power $CO_2$ or YAG laser welding site. He also suggests a lap weld joint between flat aluminum plates.

U.S. Pat. No. 5,397,857 to Farquhar suggests ultrasonically welding abutting surfaces of plastic frames to hold two stamped steel covers for a PCMCIA card. Resistance welding of metal butt joints is also disclosed.

"Credit Card Adaptor Cover Set" by M. J Lawrence, F. E. Morene and A. E. Ridley in *IBM Technical Disclosure Bulletin* Vol 37, No. 08, Aug. 94, p51, suggests a single piece cover for a PCMCIA card and providing a spring contact in the cover to touch grounding tabs on the electronic card assembly.

Continuous laser welds have been used to connect butt joints along three edges of stainless steel covers for PCMCIA cards. The butt welds are about at the midlevel of the edge walls of the cards. Accurate positioning of the butt edges of the seam for such welds is very difficult and costly to maintain and if not precisely maintained may result in the beam entering the card and damaging the contents.

Various metal snap together covers are available from A.K. Stamping company and other suppliers.

SUMMARY OF THE INVENTION

In the invention of Applicants', the metal cover of a snap together PCMCIA card is tack welded at the snapped seams. The Applicant's have discovered that this can be done without an unreasonable standard of accuracy, cheaply, and without damaging the sensitive electronic components, if the seam is a lap joint, the weld is reasonably small, and the weld does not penetrate fully through the final layer of the seam. The Applicants' have also discovered that this operation can substantially increase the mechanical strength, increase moisture resistance, and eliminate the risk of accidental opening of the card. Also, it was found that the internal frame along the longitudinal edges of the card could be made substantially narrower so that the area available for electronic components is increased and the strength and stiffness requirements of the PCMCIA PC Card Standard could still be met. The Applicants discovered that only a few small tack welds were required to achieve these results so that the welds could be performed at a high rate with minimal cost compared to continuous welds.

During welding a fixture holds the seams in reasonably precise position and tightly closed so the snap seams are much tighter after welding than when the card is only snapped closed. The precise positioning of the seams also allows the size of the weld to be minimized which reduces the risk of burn through and damage to electronic components that are enclosed within the card during welding.

BRIEF DESCRIPTION OF THE DRAWINGS

FIG. 24 schematically shows apparatus for making the welded PCMCIA cards of the invention.

ENABLING DESCRIPTION OF THE INVENTION AND THE BEST MODE

Figure 1:
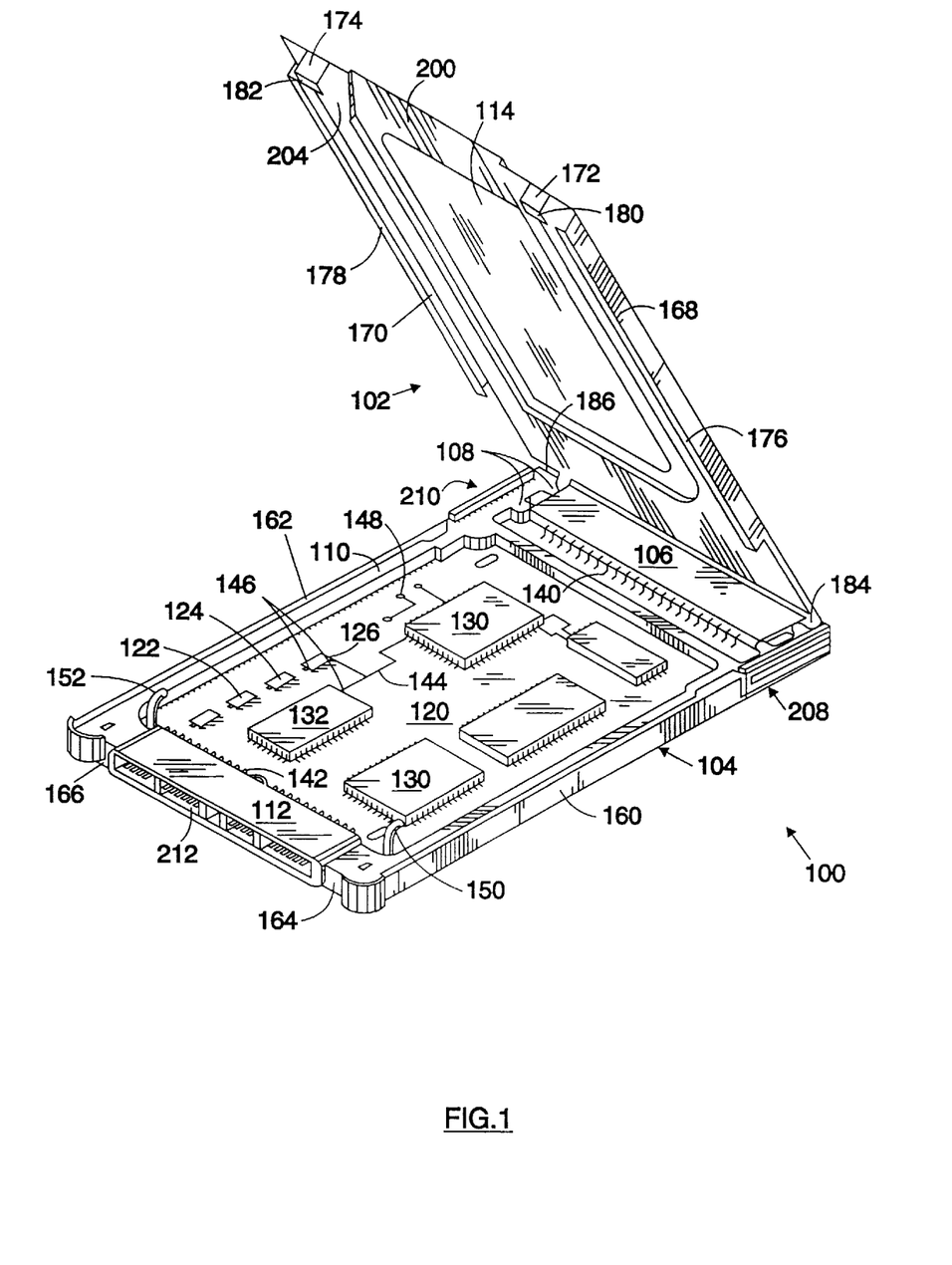
FIG. 1 is an isometric view of an open PCMCIA card of the invention prior to snapping the cover together.

In FIG. 1, PCMCIA card 100 of the invention has a top cover 102 open about 60 degrees. Preferably, the cover is metallic and has a non-corrosive surface such as anodized or chromate conversion aluminum; nickel or chromium plated steel; or more preferably, stainless steel; most preferably type 304 stainless steel. The cover is preferably about 0.05 to 0.6 mm thick, more preferably, 0.1 to 0.3 mm thick, even more preferably, 0.15 to 0.25 mm thick or about 0.2 mm thick. Arranged in the bottom cover 104, a female PCMCIA connector 106 is restrained in the longitudinal direction of the card, by fingers 108 projecting inwardly from frame 110 which is integrally molded to distal connector 112. Preferably, the frame is an organic material such as epoxy filled with glass fibers or polycarbonate filled with glass fibers, such as LEXAN™ (trade mark of General Electric). Preferably the frame is about 1 to 9 mm wide, more preferably about 1.5 to 5 mm wide, even more preferably 2 to 4 mm wide or about 3 mm wide. Portions 114, 116 (see FIG. 4) of the inside of respective top and bottom covers are preferably coated with organic dielectric to electrically isolate the components from the cover to protect them from static and prevent shorts.

In FIG. 1, a circuit board assembly 120 includes surface mount discretes such as resistors 122, capacitators 124, and power transistors 126, and includes surface mounted integrated chip modules such at quad flat packs (QFP's) 130, and thin small outline packages (TSOP's) 132. The circuit board is supported by leads 140 connecting to PCMCIA connector 106 and by leads 142 connected to distal connector 112. Surface conductors 144 interconnect leads 146 of discrete and integrated components and through holes 148. Fingers 150, 152 extend upward to electrically connect the metal cover to the ground system of the card.

On bottom cover 104, side walls 160, 162 and distal end straps 164, 166 extend straight up. On top cover 102, side walls 168, 170 and distal end straps 172, 174 have inward bent snap extensions 176, 178, 180, and 182 respectively for snapping over the side walls and distal straps of the bottom cover. Preferably, the extensions are 0.4 to 1.6 mm wide, more preferably 0.6 to 1.0 mm wide. The extensions result in an interference fit so that in order to close the cover the edge walls of the top cover bend outward by about the width of the extensions. Then they snap over the wall they are covering and are then very difficult to reopen. The covers are of one piece, with the top and bottom parts connected by straps 184, 186 along each side of the PCMCIA connector.

Figure 2:
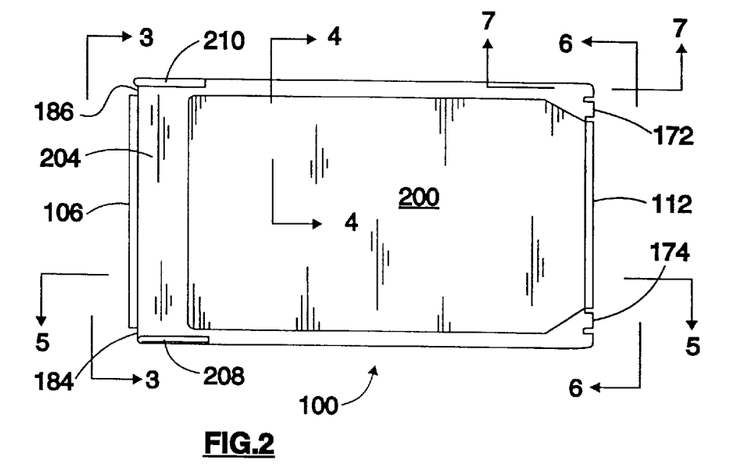
FIG. 2 is a top view of the card of the invention after assembly is completed by snapping together the two-parts of the one-piece cover.

In FIG. 2 PCMCIA card 100 of FIG. 1 is snapped shut and welded. The top and bottom covers have similar thicker areas 200, 202 (best seen in FIG. 4) partially surrounded by a thinner border areas 204, 206 along two or three edges.

Figure 3:
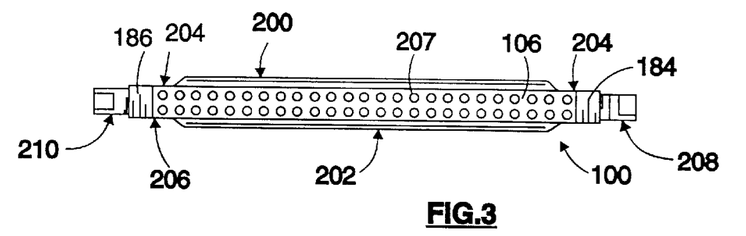
FIG. 3 is an end view of the card of FIG. 2 from line 3—3 showing the 36 pin PCMCIA connector.

In FIG. 3 PCMCIA card 100 has connector holes 207 of the female PCMCIA connector for insertion into a PCMCIA slot accessible from the outside of a computer enclosure for communication in a computer system. The card may include polarizing keys 208, 210 which are sections of the frame at cut away parts of the cover, and which are different to prevent the card from being inserted upside down.

Figure 4:
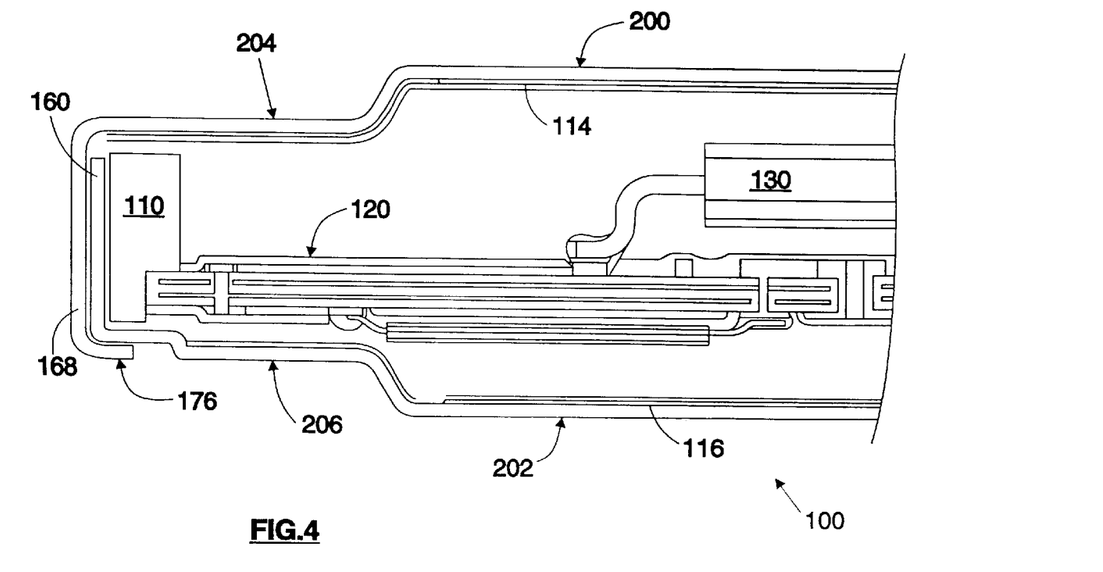
FIG. 4 is a partial section showing the snap fit along the longitudinal edge of the card of FIG. 2 through line 4—4.

In FIG. 4, card 100 includes a snap fit seam along the longitudinal edge of card 100. Once the card is closed extension 176 snaps over the base of edge wall 160 to hold the card mechanically together. Thinner borders 204, 206 and thicker central sections 200, 202 are easily seen.

Figures 5, 7:
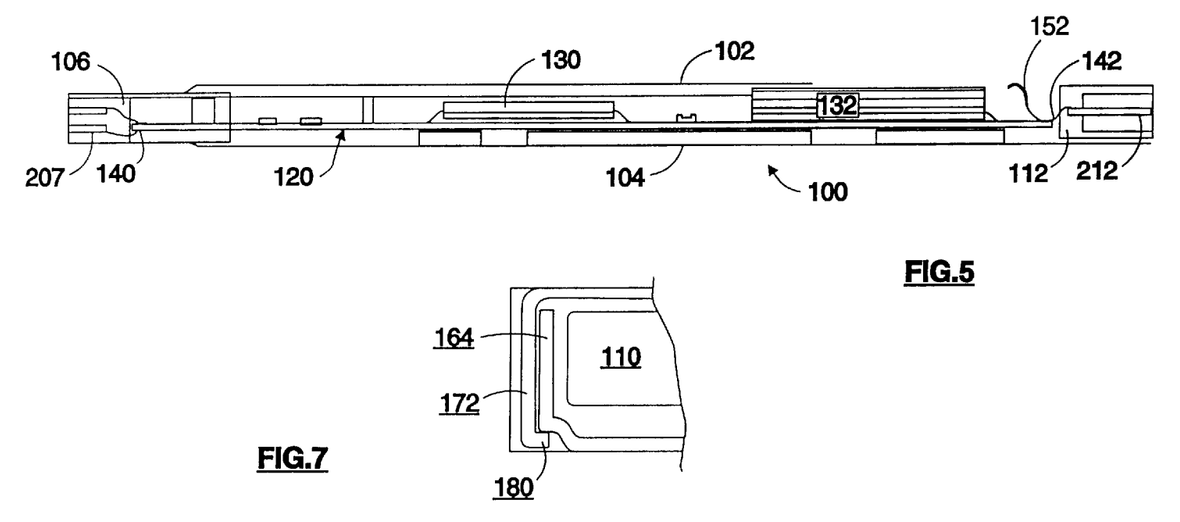
FIG. 5 is a section of the card of FIG. 2 through line 5—5 showing the enclosed circuit board assembly attached to end connectors.
FIG. 7 is a partial section of the card of FIG. 2 through line 7—7 showing the snap fit at the straps at the end of the card.

In FIG. 5, card 100 includes enclosed circuit board assembly 120 attached to end connectors 106, 112.

Figure 6:
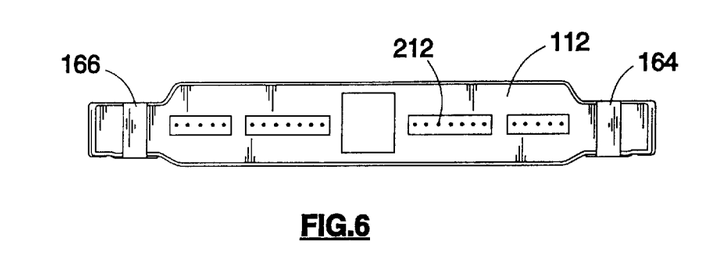
FIG. 6 is an end view of the card of FIG. 2 from line 6—6 showing an example of an optional connector at the distal end from the PCMCIA connector.

In FIG. 6, card 100 includes pins 212 of an example of an optional connector 112 at the distal end of the card from the PCMCIA connector.

In FIG. 7, extension 180 of top strap 172 is snapped over bottom strap 164 at the distal end of the card.

Figure 8:
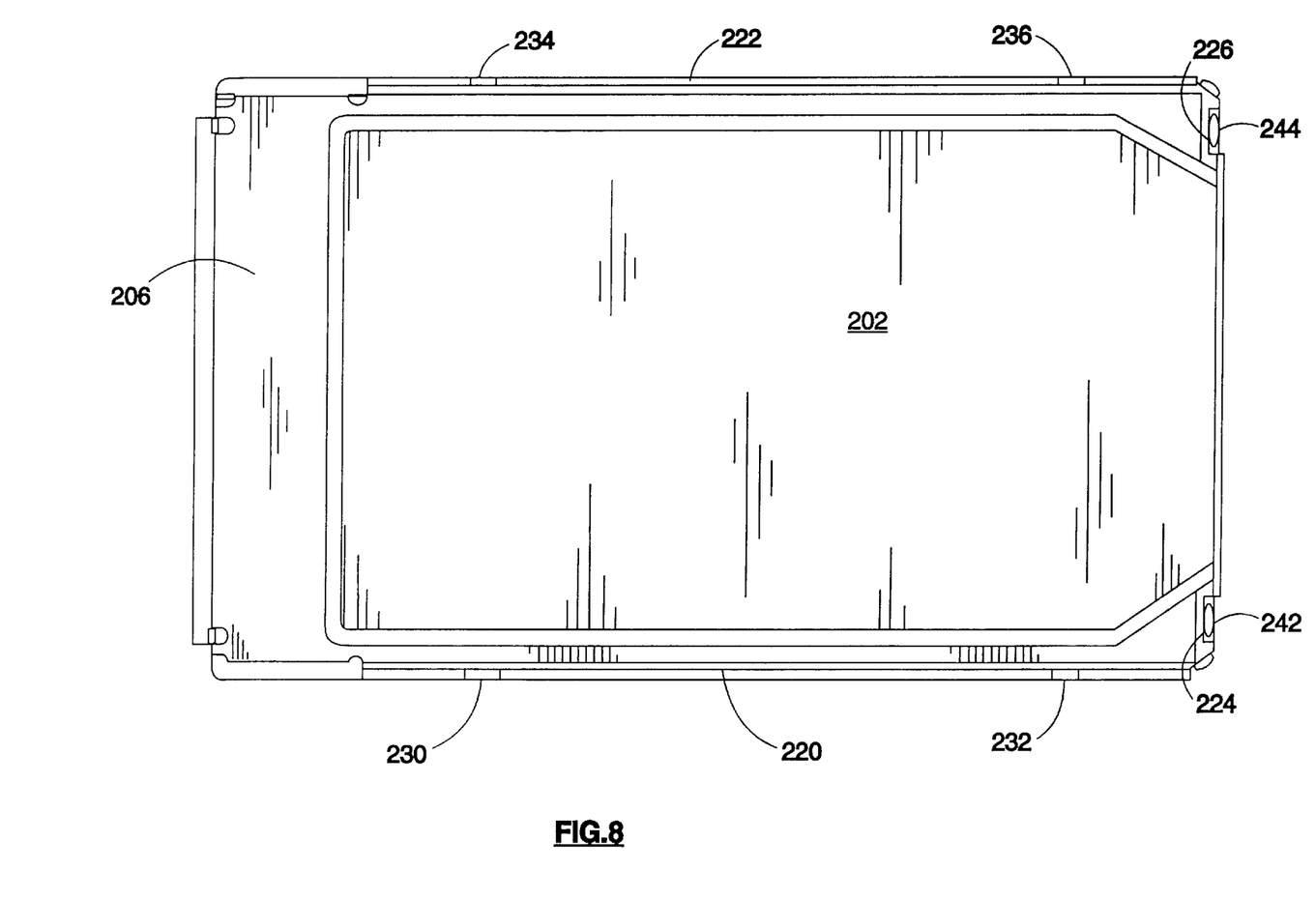
FIG. 8 is a bottom view of the card of FIG. 2 showing the snap together seams along the longitudinal edges and distal end opposite from the PCMCIA connector and the reinforcing tack welds.

In FIG. 8, card 100 includes snap together seams 220, 222 along the longitudinal edges and snap together seams 224, 226 of the straps at the distal end of the card. On the longitudinal edges of the card two tack welds 230, 232 reinforce snap seam 220 and two tack welds 234, 236 reinforce snap seam 222. The welds along the longitudinal edges may be continuous welds over a major portion of the lap joint seam, but 1 to 6 tack welds along the seam may be made more quickly and accurately and at less cost. More preferably one tack weld about 8 mm from the end of each snapped lap joint provides sufficient benefit at minimal cost and effort. On the distal end of the card tack weld 242 reinforces seam 224 and tack weld reinforces seam 226. The welds are about 0.5 mm to about 1.2 mm wide and preferably, about 0.8 mm to about 0.9 mm wide or about 0.85 mm. The welds about 0.5 to about 3.0 mm long, more preferably, less than about 2 mm long, and most preferably, about 1 mm long.

Figure 9:
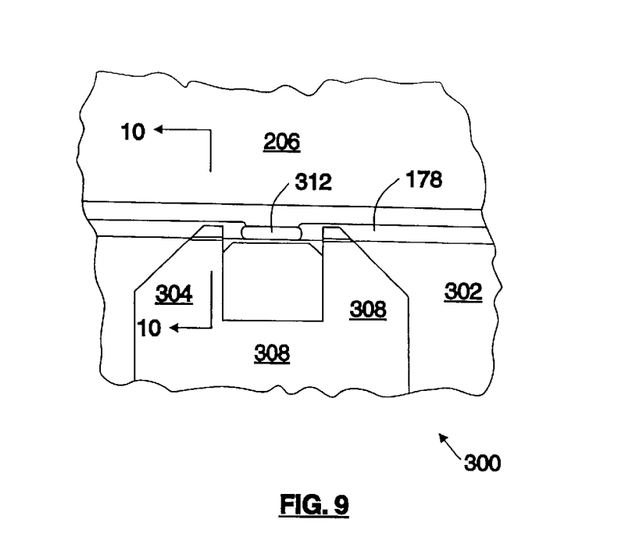
FIG. 9 shows a bottom view of a part of card of FIG. 2 with fixturing for holding the seam in position during welding.
Figure 10:
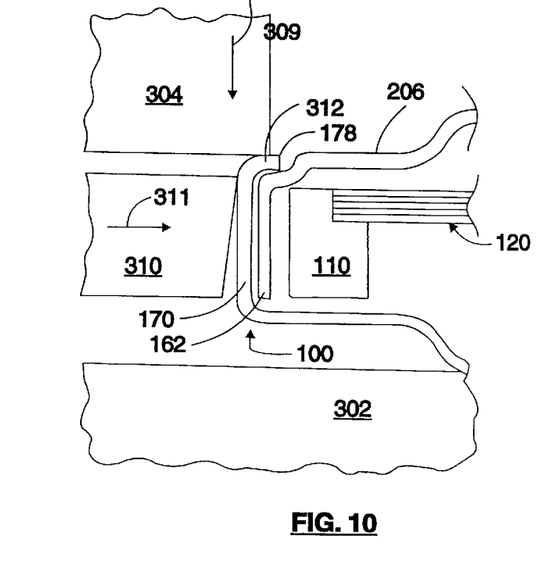
FIG. 10 is a partial section of the card of FIG. 2 and fixturing of FIG. 9 through-line 10—10 showing the seam positioned by the fixturing.

In FIGS. 9 and 10, fixturing 300 holds the seam in position during welding. Card 100 in FIG. 10 is shown in inverted position with the bottom of the card at the top of the figure. Frame 302 supports the card while fingers 304, 306 of ram 308 moves the seam down as shown by arrow 309, into precise vertical position with the snapping extension overlapping and against the edge of the bottom of the card; and ram 310 moves the seam as shown by arrow 311 into precise horizontal position for making weld 312.

Figure 11:
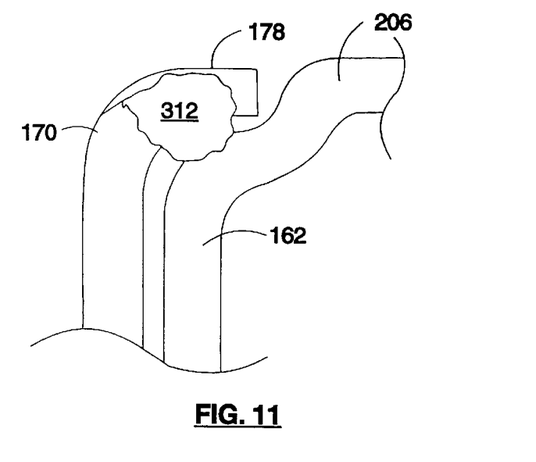
FIG. 11 is an expanded view of part of the section of FIG. 10 showing the tack weld reinforcing the seam.

In FIG. 11 the tack weld 312 reinforces the lap seam. Preferably the welds have a metallurgy and microstructure indicating that the weld has been precisely positioned and locally held together during welding and that the weld was made by an ion beam or electro beam or more preferably by a laser beam. Preferably, the weld metallurgy and surface microstructure indicate that the weld was made in an oxygen free atmosphere (e.g. nitrogen), more preferably a nobel gas atmosphere such as helium or argon is used. Preferably the color of the weld is about the same as the surrounding metal. Preferably, the weld penetrates fully through the first (most external) metal layer of the lap seam and into the surface of the second (more internal) metal layer as shown, but preferably, not fully through the second layer. More preferably, the weld penetrates 30% to 90% through the second layer, most preferably about 60%.

Figure 12:
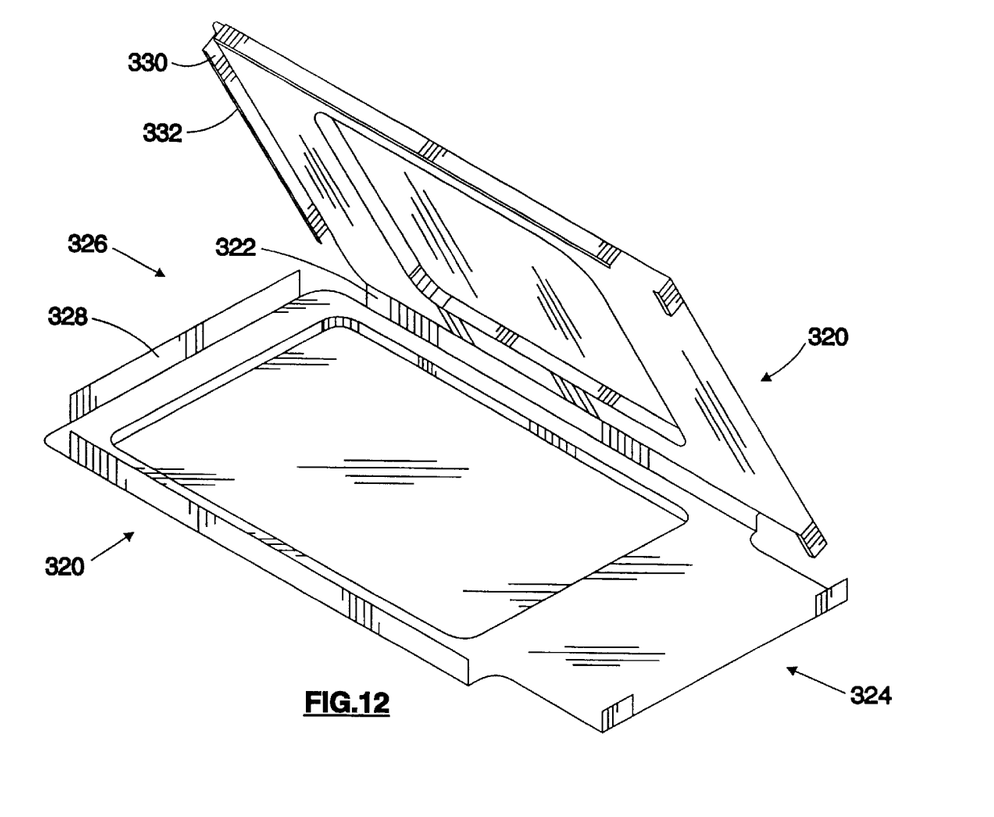
FIG. 12 is an isometric view of a one part cover of another embodiment of the invention.
Figure 13:
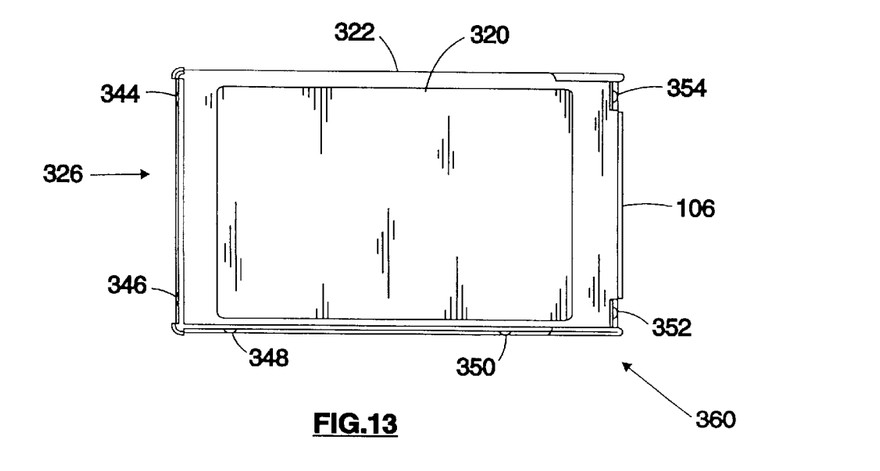
FIG. 13 is a bottom view of the assembled card using the cover of FIG. 12 and showing the tack welds.

In FIG. 12, in a second embodiment of the card of the invention, the top and bottom of cover 320 are connected by edge sidewall 322. In this embodiment end 324 is open for holding a PCMCIA connector and the other end 326 has bottom end wall 328 and top end wall 330 with extension 332 which snaps over the bottom cover. Cover 320 has bottom end straps and top end straps with snap projections similar to those previously discussed in reference to FIG. 1. In FIG. 13 on the bottom of assembled card 360 tack welds 344, 346, are at the edge seam at the distal end of the card from the PCMCIA connector 106; tack welds 348, 350 are along the longitudinal edge seam opposite from connecting wall 322; and tack welds 352, 354 are at the straps on either side of the opening for the PCMCIA connector 106.

Figure 14:
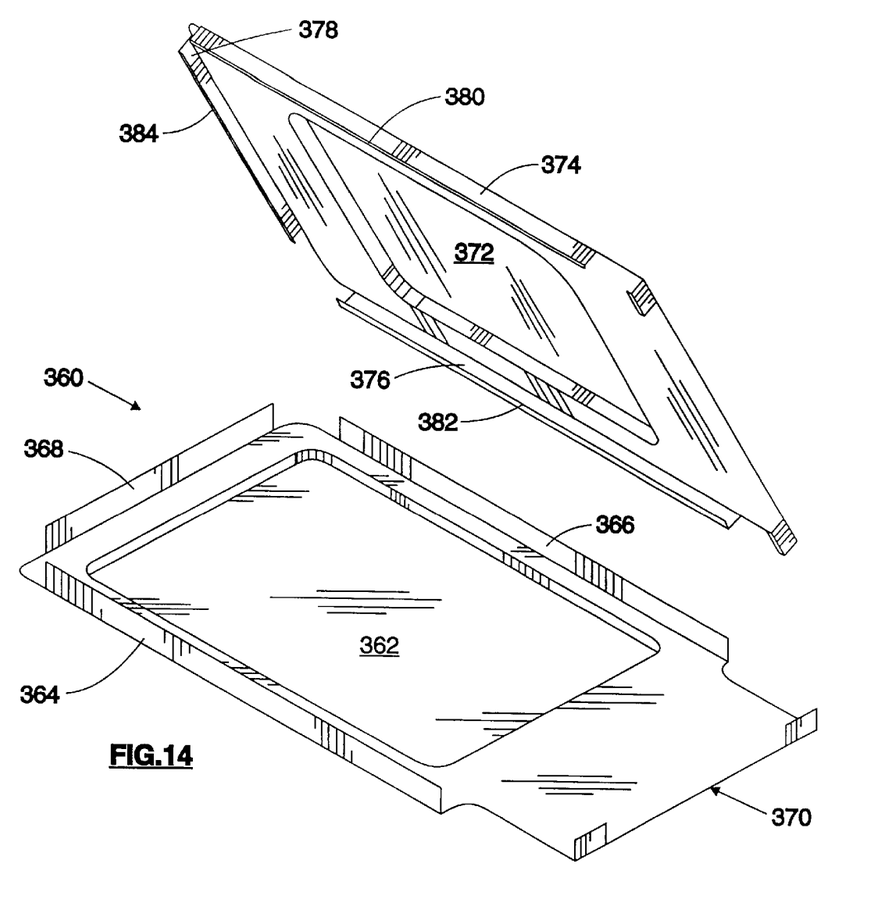
FIG. 14 is an isometric view of a two part cover of another embodiment of the invention.

In FIG. 14 in a third embodiment of the card of the invention, bottom part 362 of the cover 360 has edge walls 364, 366 along a major portion of the longitudinal edges and edge wall 368 along the end opposite from opening 370 for the PCMCIA card. The top part 372 of the cover 360 has edge walls 374, 376 along a major portion of the longitudinal edges and edge wall 378 along the end opposite from opening 370. Each of the walls 374, 376, 378 includes a snap projection 380, 382, 384 respectively for snapping over walls 364, 366, 368 respectively of the bottom part of cover 360, to form lap seams on the bottom of the card. Again cover 360 has two bottom end straps and corresponding top end straps with snap projections similar to those previously discussed in reference to FIG. 1.

Figure 15:
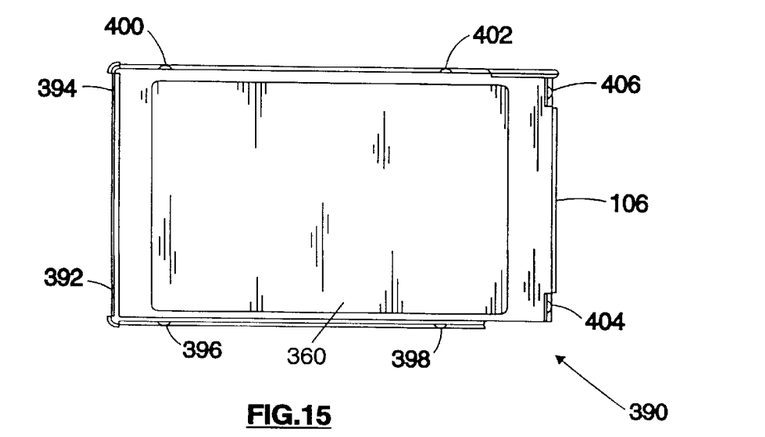
FIG. 15 is a bottom view of the assembled card using the cover of FIG. 14 and showing the tack welds.

In FIG. 15 on the bottom of assembled card 390, the tack welds 392, 394, at the edge seam at the distal end of the card from the PCMCIA connector 106, pairs of tack welds 396, 398 and 400, 402 are located along the longitudinal edge seams, and tack welds 404, 406 are located at the straps on either side of the opening for the PCMCIA connector 106.

Figure 16:
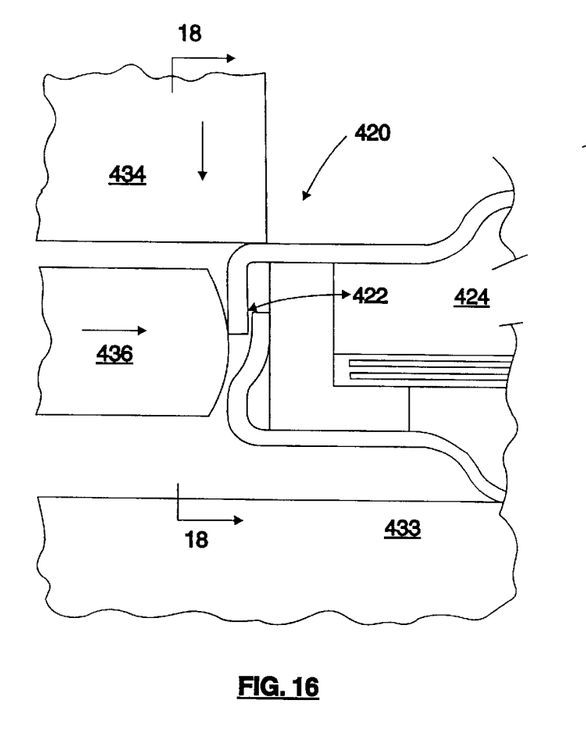
FIG. 16 is a partial section of another embodiment of the invention showing fixturing for holding the edge wall lap seam of the card during welding.
Figure 17:
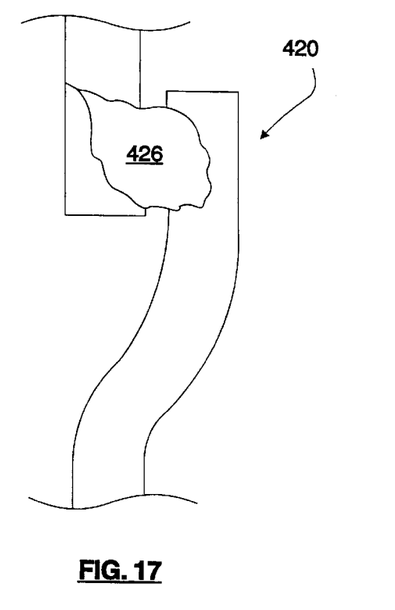
FIG. 17 is an enlarged view of the lap joint of FIG. 16 showing the tack weld.
Figure 18:
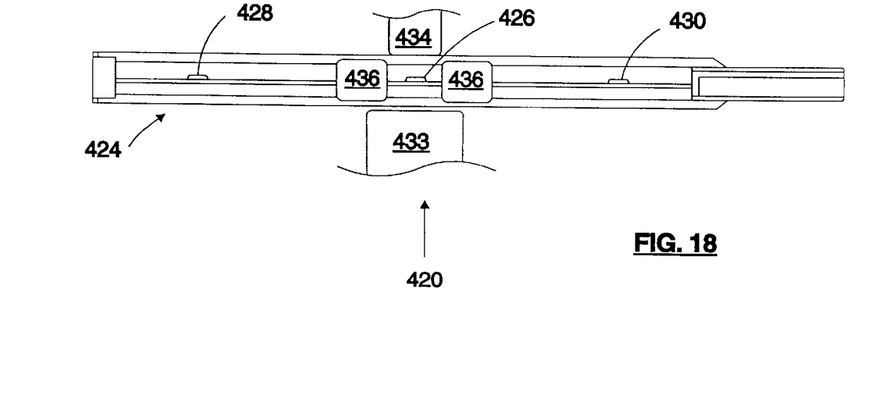
FIG. 18 is section of the fixturing through line 18—18 of FIG. 16 and is also an edge view of the card of the embodiment of FIG. 16.

In FIG. 16, in a second embodiment of the fixturing of the invention, fixturing 420 holds the edge wall lap joint seam 422 of card 424 during welding. In FIG. 17, tack weld 426 connects lap joint 422. In FIG. 18, the fixturing 420 is holding the lap joint for welding of tack weld 426, and tack welds 428 and 430 are also shown. The other longitudinal side welds are similarly placed and the welds along the end 432 may be two tack welds with the same spacing as for end 326 in FIG. 13.

Figure 19:
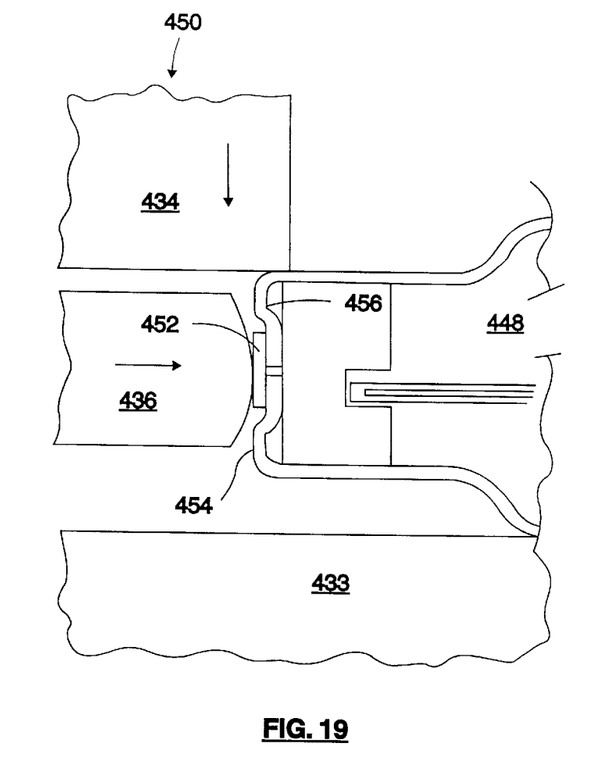
FIG. 19 is a partial section of another embodiment of the invention showing fixturing for holding the lap strip over the butting edges of side walls during welding.
Figure 20:
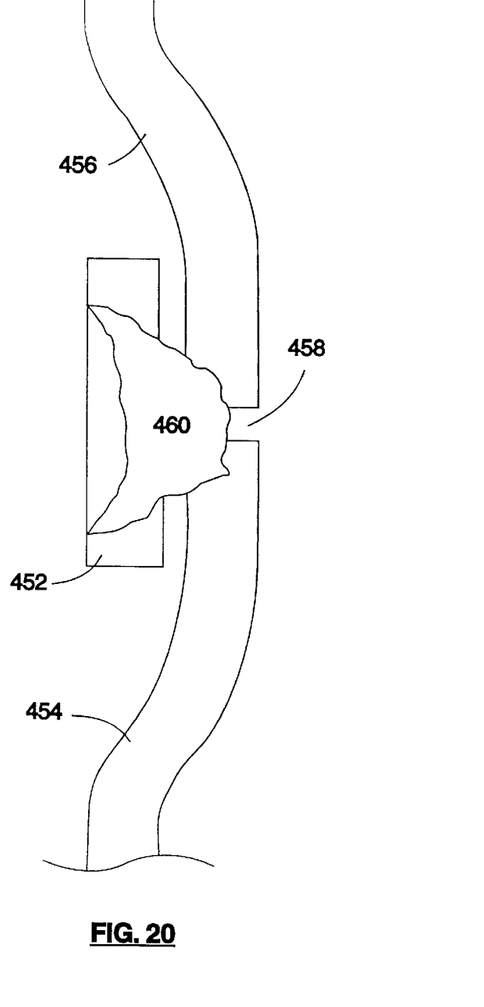
FIG. 20 is an enlarged view of the lap joint of FIG. 19 showing the tack weld.
Figure 21:
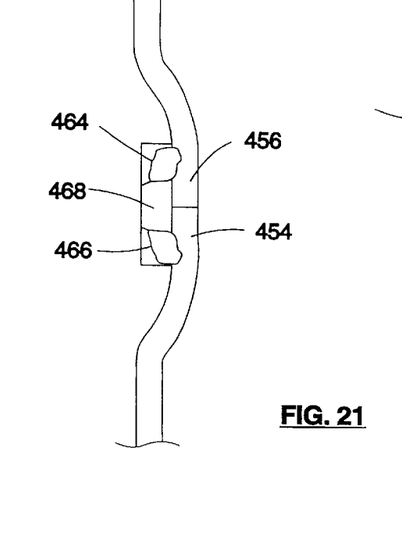
FIG. 21 is a partial cross section of another embodiment of the invention similar to that of FIG. 20, but with a double welded lap joint strip.

In FIG. 19, In a fourth embodiment of card 448 of the invention, fixturing 450 holds lap strip 452 over the butting edges of side walls 454 and 456 during welding. In FIG. 20, tack weld 460 connects strip 452 to butting ends of both wall 454 and wall 456. The strip prevents the laser beam from leaking through the space 458 between abutting edges of part 454 and part 456 of cart 448. In FIG. 21, in a fifth embodiment of the card, similar to the fourth embodiment, but with a wider strip 462, welds 464, 466 are positioned along respective edges of strip 468.

Figure 22:
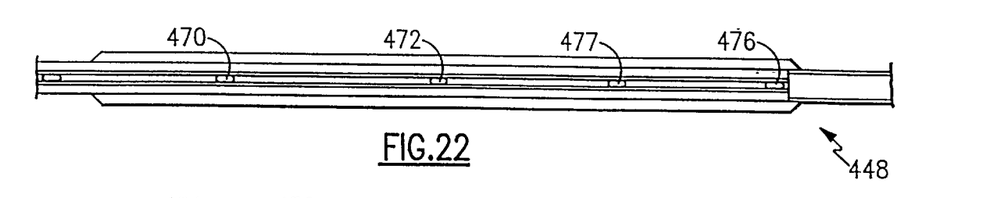
FIG. 22 is an edge view of the card of the embodiment of FIG. 19 showing the location of the lap welds.
Figure 23:
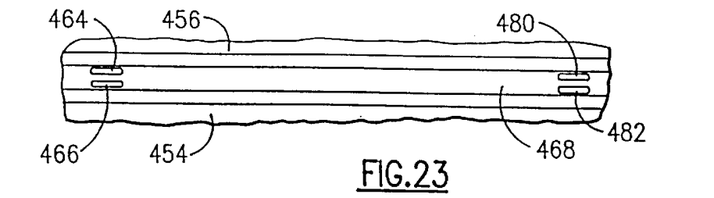
FIG. 23 is an enlarged edge view of a part of the card of the embodiment of FIG. 21 showing an alternating configuration of lap welds.

In FIG. 22, the location of the lap welds 470, 472, 474, and 476 are shown. Additional lap welds may be used as shown to hold the thin narrow strip against the card. In FIG. 23, the lap welds 464,466 along the lap strip 468 hold the top and bottom parts 454 and 456 of card 448 together.

Figure 24:
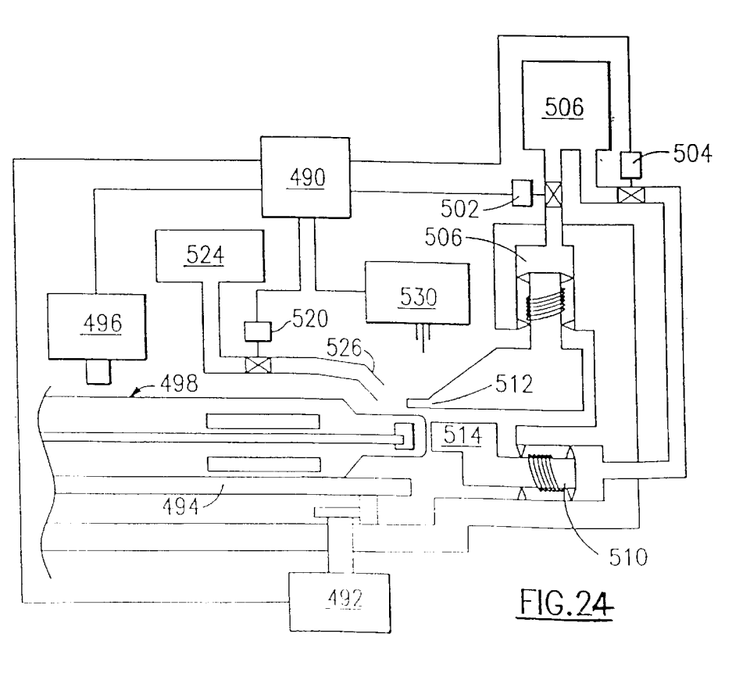
FIG. 24 is another edge view.

In FIG. 25 controller 490 preferably, a computer, activates motor 492 to move conveyer 494 until the controller receives a signal from card detector 496 preferably a vision system, that the PCMCIA card 498 is in position for welding. The controller activates 3-way solenoid valves 502, 504 or a functionally similar valve arrangement, to admit hydraulic or pneumatic fluid from source 506 into cylinders 508, 510 respectively to move fingers 512 and ram 514 to hold a seam of card 516 in precise position for laser welding. Alternatively, the fingers can be activated by linear electric motors or solenoids. Preferably, controller 490 activates valve 520 to dispense a gas from source 524 to nozzle 526 to provide an atmosphere essentially free of oxygen at the seam for welding. The source is preferably, a bottle of nitrogen or more preferably, argon. This results in very small collarless welds which are unnoticed by the customer. Then controller 500 activates beam welder 530 to weld the lap seam together. Preferably, the welder is an ion beam welder or electron beam welder or more preferably a laser such as a $CO_2$ and most preferably a pulsed Nd:YAG laser with a peak power of about 0.8 KW and a spot size of about 0.6 mm. After welding, controller 490 activates valves 502, 504 to release pressure and springs 532, 534 move the fingers 512 and ram 514 away from the card, and then the controller restarts conveyer motor 492. More preferably the operation is so fast that conveyer motor 492 can be continuously operated.

Figure 25:
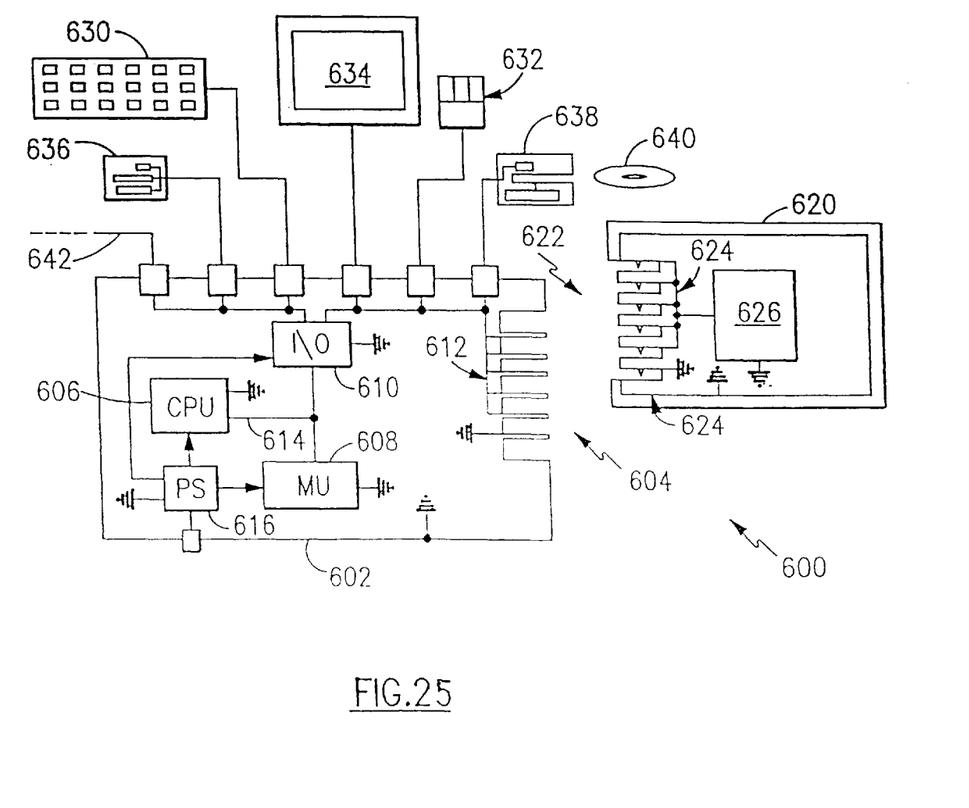
FIG. 25 schematically illustrates the information handling system of the invention.

In FIG. 25, an information handling system 600 includes an enclosure 602 for a computer node, including an externally accessed slot 604. The enclosure contains: one or more central processing units (CPUs) 606; memory units 608; input and/or output (I/O) units 610 including a first connector 612 at the slot; buses 614 to interconnect the units; and power supply 616 to operate the units.

The system also includes an enclosure 620 for a cartridge, including an opening 622 for a second connector 624. The cartridge may be plugged into the slot of the computer node for communication between the first connector and second connector and contains an electronic circuit 626 communicating with second connector to provide peripheral functions.

The memory units may include read only memory (ROM), programmable ROM (PROM), erasable PROM (EPROM), electrically erasable PROM (EEPROM), flash memory, dynamic RAM, static RAM, bubble memory, EPROM, or other memory that can be accessed at a word or line level. The I/O unit may provide: communication with user input devices such as keyboard 630 and mouse 632 (or camera or microphone not shown); output devices such as screen 634 (CRT or LCD), (or speakers not shown); storage units such as hard drive 636 or drive 638 for removable media 640 (tape, floppy, CDROM, etc.); and network communications 642 (token ring, either net, coax video cable, radio, cellular phone, modems). The power supply may include batteries and preferably, includes a connector 640 for external power. The peripherals provided by the card preferably include one or more of: additional CPU's, memory units (RAM, storage units), or I/O units (network, modem, cellular phone, sound, video), not shown.

The above description is provided for understanding but does not limit the scope of, the following claims. Those skilled in the art can make numerous modifications to the above described embodiments of the invention within the spirit of the invention. Accordingly, the scope of the invention is only limited by the following claims and equivalents thereto.

We claim:

1. An apparatus for producing computer cartridges, said apparatus comprising:

a fixture which can be activated for holding lap joint seams of two metal sidewalls of a cartridge along the edges of said cartridge with the exterior metal layer of one of said sidewalls substantially in contact with a metal layer of the other of said sidewalls;

a laser welding machine with a welding head at the fixture, which can be activated for automatically welding the lap joint seams;

sensing means for sensing the position of said cartridge and for signaling when said sensing occurs;

controllable conveyor means for automatically moving said cartridge into and out from said fixture; and automatic control means for automatically controlling said conveyor means for positioning said cartridge, depending on a signal or signals received from said sensing means, for activating said fixture, and for operating said laser welding machine to weld the lap joints of said cartridge.

2. The apparatus of claim 1 in which:

said fixture includes fingers extending on both sides of the weld for holding said metal layers of the lap joint together; and said apparatus further includes cover gas supply means for providing an oxygen free atmosphere around said weld during said welding.

3. The apparatus of claim 1 wherein said automatic control means comprises a programmable computer.

4. The apparatus of claim 1 wherein said laser welding machine is a pulse Nd:YAG laser.

5. The apparatus of claim 1 wherein said sensing means comprises a machine vision system.

6. The apparatus of claim 2 wherein said cover gas supply means comprises a bottle of argon.

7. The apparatus of claim 2 further including a ram for laterally positioning said seam.

* * * * *